United States Patent [19]

Varnell et al.

[11] Patent Number: 4,806,596

[45] Date of Patent: Feb. 21, 1989

[54] HOMOGENEOUS THERMOSET COPOLYMERS

[75] Inventors: William D. Varnell, Stoddard; Thomas D. Newton, Onalaska; Mark D. Holte, La Crosse, all of Wis.

[73] Assignee: Allied-Signal, Inc., Morris Township, Morris County, N.J.

[21] Appl. No.: 871,965

[22] Filed: Jun. 9, 1986

[51] Int. Cl.$^4$ ............................................. C08F 261/06
[52] U.S. Cl. ................................... 525/312; 525/289; 525/291; 525/925
[58] Field of Search ............... 525/232, 925, 241, 215, 525/312, 291, 289; 568/646

[56] References Cited

U.S. PATENT DOCUMENTS 4,039,630 8/1977 Kanagawa et al. ................. 525/342

Primary Examiner—Jacob Ziegler
Attorney, Agent, or Firm—Raymond H. Nelson; Jay P. Friedenson; Harold N. Wells

[57] ABSTRACT

Homogeneous thermoset copolymers which may be used in the preparation of laminates for circuitry boards will comprise a poly(vinyl benzyl ether) of a polyphenol and a polyalkadiene in which the alkadiene monomer will contain from 3 to about 8 carbon atoms. The polymers are prepared by admixing a solution of the poly(vinyl benzyl ether) of a polyphenol dissolved in an organic solvent with a solution of the polyalkadiene also dissolved in an organic solvent. The admixing is done at an elevated temperature to form the desired composite. The resulting copolymer will possess desirable characteristics such as high glass transition temperature and low dielectric constant.

12 Claims, No Drawings

HOMOGENEOUS THERMOSET COPOLYMERS

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a homogeneous thermoset copolymer of a poly(vinyl benzyl ether) of a polyphenol and a polyalkadiene may be used in the preparation of laminates which themselves will form a component of a circuit board and will possess the desirable characteristics hereinbefore set forth.

BRIEF SUMMARY OF THE INVENTION

This invention relates to homogeneous thermoset copolymers. More specifically, the invention is concerned with novel high temperature homogeneous thermoset copolymers and to a method for the preparation thereof. As was previously mentioned, the homogeneous thermoset copolymers of the present invention, which constitute novel compositions of matter, may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "cross-talk" and line capacitance. This results in faster PWB circuitry and, in addition, provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. The coefficient of expansion of the novel homogeneous thermoset co-polymers of the present invention will be comparable to a polyimide matrix. Furthermore, the thermal stability of the polymer matrix must be relatively high in nature inasmuch as the matrix must possess the ability to withstand soldering temperatures without melting or degrading. A desirable characteristic of the homogeneous thermoset copolymer of the present invention is that the thermal stability of the polymer is comparable to a polyimide matrix.

In addition, by varying the ratio of the poly(vinyl benzyl ether) of a polyphenol to the polyalkadiene, it is possible to provide a wide range of properties which will meet various and specific circuit board requirements. Furthermore, it is possible by preparing the copolymers in a manner also hereinafter set forth in greater detail, to provide a copolymer which will meet the requirement for chip encapsulation and potting materials.

It is therefore an object of this invention to provide novel homogeneous thermoset copolymers.

Another object of this invention is to provide a method for preparing homogeneous thermoset copolymers which are useful as a component in circuit board laminates.

In one aspect, an embodiment of this invention resides in a homogeneous thermoset copolymer of a poly(vinyl benzyl ether) of a polyphenol having the structure:

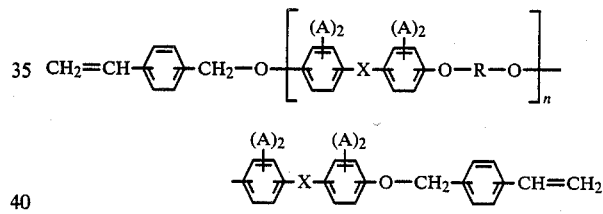

in which X is selected from the group consisting of

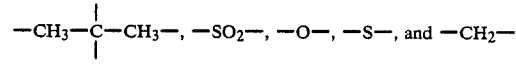

radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20, and a polyalkadiene in which the alkadiene monomer contains from 3 to about 8 carbon atoms.

Another embodiment of this invention is found in a process for the production of a homogeneous thermoset copolymer which comprises reacting a poly(vinyl benzyl ether) of a polyphenol having the structure:

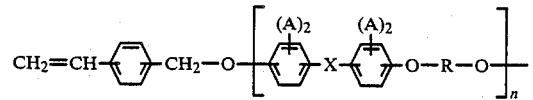

-continued

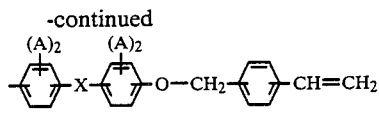

in which X is selected from the group consisting of

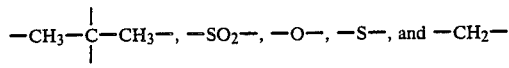

radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$— and —CH$_2$—C≡C—CH$_2$— radicals, A is independently selected from the group consisting of hydrogen, chlorine, bromine, fluorine, alkyl, alkoxy and phenyl radicals and n has an average value in the range of from about 0 to about 20 with a polyalkadiene in which the alkadiene monomer contains from 3 to about 8 carbon atoms at reaction conditions and recovering the resultant homogeneous thermoset copolymer.

A specific embodiment of this invention resides in a homogeneous thermoset copolymer of styrenated tetrabromosubstituted p,p'-isopropylidenediphenol and 1,2-polybutadiene.

Another embodiment of this invention is found in a process for the preparation of a homogeneous thermoset copolymer which comprises reacting a solution containing styrenated tetrabromosubstituted p,p'-isopropylidenediphenol with a solution containing 1,2-polybutadiene at a temperature in the range of from about 50° C. to about 100° C. and a pressure in the range of from about atmospheric to about 100 atmospheres, and recovering the resultant homogeneous thermoset copolymer.

Other objects and embodiments will be found in the following further detailed description of the invention.

DETAILED DESCRIPTION OF THE INVENTION

As hereinbefore set forth, the present invention is concerned with novel homogeneous thermoset copolymers and to a method for the preparation of these copolymers. The homogeneous thermoset copolymers will comprise a mixture of a poly(vinyl benzyl ether) of a polyphenol and a polyalkadiene, examples of these compounds being hereinafter set forth in greater detail. The copolymerization of these compounds will result in a copolymer which, because of its particular structure, will be useful in electronic circuitry, said composite possessing a relatively low dielectric constant and a high glass transition temperature, these characteristics being of particular advantage for use in circuit boards.

The poly(vinyl benzyl ether) of a polyphenol which forms one component of the copolymer of the present invention will possess the generic structure:

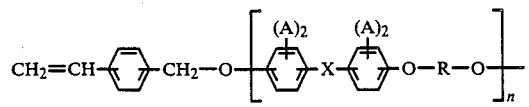

-continued

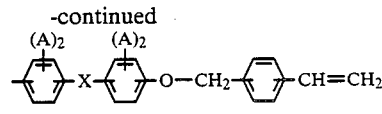

in which X is selected from the group consisting of

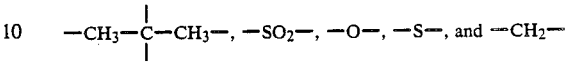

radicals, R is selected from the group consisting of —CH$_2$—C$_6$H$_4$—CH$_2$—,(CH$_2$)$_b$ in which b ranges from 1 to about 6, —CH$_2$—CH=CH—CH$_2$— and —CH$_2$—C≡C—CH$_2$— radicals, A is independently selected from the group consisting of hydrogen, chlorine, bromine, fluorine, alkyl, alkoxy and phenyl radicals and n has an average value in the range of from about 0 to about 20.

The second component of the copolymer of the present invention will comprise a polyalkadiene in which the alkadiene monomer will contain from 3 to about 8 carbon atoms. Some specific examples of these polyalkadienes will include polypropadiene, 1,2-polybutadiene, 1,3-polybutadiene, 1,2-polypentadiene, 1,3-polypentadiene, 1,4-polypentadiene, 1,2-polyhexadiene, 1,3-polyhexadiene, 1,4-polyhexadiene, 1,2-polyheptadiene, 1,3-polyheptadiene, 1,4-polyheptadiene, 1,5-polyheptadiene, 1,2-polyoctadiene, 1,3-polyoctadiene, 1,4-polyoctadiene, 1,5-polyoctadiene, 1,6-polyoctadiene, etc.

The novel homogeneous thermoset copolymers of the present invention may be prepared in any suitable manner of operation which is known in the art. For example, one method of preparing the copolymer is to blend the two components hereinbefore described to form a homogeneous melt, said blending being effected at a temperature in the range of from about 100° C. to about 200° C. The homogeneous melt may then be poured into a mold or utilized in other various ways such as encapsulating a chip, and cured at an elevated temperature in the range of from about 150° C. to about 200° C. for a period of time which may range from about 0.1 to about 1 hour, and thereafter may be post-cured at a temperature ranging from about 200° C. to about 260° C. for a period of time which may range from about 1 to about 12 hours in duration.

Alternatively, another method of preparing the desired copolymer of the present invention is to dissolve the poly(vinyl benzyl ether) of a polyphenol and the polyalkadiene in an appropriate solvent such as dimethyl formamide, N-methylpyrrolidinone, dimethyl acetamide, acetone, benzene, toluene, etc., in amounts so that the resulting solution will contain from about 30 to about 70% by weight of the components of the copolymer. The resulting solution may then be coated and/or impregnated on an appropriate substrate such as various resins, glass cloth, etc., and treated at an elevated temperature of from about 150° C. to about 180° C. for a relatively short period of time, which may range from about 1 to about 10 minutes, to obtain a prepreg. The resulting prepreg may then be stacked by pressing a predetermined number of sheets of the prepreg and pressing the stack in a heated press to form a desired laminate. The pressing of the prepreg may be effected for a period of time ranging from about 1 to about 4 hours in duration at an elevated temperature ranging from about 150° C. to about 190° C., at a pressure in the range of from about 500 to about 1,000 pounds per square inch gauge. Following the pressing, the laminate is then subjected to a post-cure which is effected at a temperature in the range of from about 200° C. to about 260° C. for a period of time which may range from about 3 to about 16 hours in duration.

It is also contemplated within the scope of this invention that the homogeneous thermoset copolymers may be prepared in a continuous manner of operation. When this type of operation is employed, the predetermined amounts of the poly(vinyl benzyl ether) of a polyphenol and the polyalkadiene which have been dissolved in an appropriate solvent of the type hereinbefore set forth in greater detail, are continuously charged to a zone which is maintained at the proper operating conditions of temperature and pressure. Those skilled in the art will recognize that a continuous reactant charge is necessary, with amounts depending upon the individual components, to provide a high yield of product which contains the desired percentage of each component in the finished homogeneous thermoset copolymers. After passage through this zone, the mixture resulting therefrom may be continuously withdrawn and utilized to coat and/or impregnate a substrate or reinforcement. The coated or impregnated substrate or reinforcement may thereafter be continuously charged to a curing zone where it is subjected to a partial cure by passage through this zone which is maintained at varying operating temperatures for a predetermined period of time. After passage through the zone, the resulting prepreg material is continuously withdrawn and passed to storage. The prepreg can then be layed up as sheets with or without a metal such as copper foil as an electrical or thermal conductor, and pressed in a predetermined number of sheets to form the desired laminate or circuit board matrix.

It is also within the scope of this invention that the circuit board precursor may be prepared by a solventless continuation lamination process. When this type of process is employed, the solid resin blend comprising at least one poly(vinyl benzyl ether) of a polyphenol and a polyalkadiene is used to impregnate a reinforcement such as glass cloth which is continuously fed through an appropriate apparatus. The reinforcement such as the glass cloth may pass through this apparatus in a single ply or, if so desired, in a predetermined number of plies, one criteria being that each ply is impregnated with the resin blend. As an alternative, it is also contemplated that, if the laminate is to be used as a circuit board, one or both sides of the laminate may be covered with a metallic coating such as copper foil. The laminate is then passed through the apparatus under predetermined conditions of temperature and pressure so as to provide a finished and cured laminate which emerges from the apparatus. This metal-covered laminate or uncovered laminate may then be cut into desired sizes and utilized, as hereinbefore set forth, as a circuit board in various electric or electronic devices.

Regardless of the method which is utilized to form the desired copolymer of this invention, it is contemplated that the two components of the final composition of matter may be present in various weight ratios. In the preferred embodiment of this invention, the poly(vinyl benzyl ether) of a polyphenol will be present in the finished composite in an amount in the range of from about 80 to about 35% by weight, while conversely the polyalkadiene component of the copolymer will be present in an amount in the range of from about 20 to about 65% by weight. While these weight ratios are preferred, it is also contemplated within the scope of this invention that either of the two components may be present in the finished composite in either a greater amount or a lesser amount, depending upon the particular properties which are desired to be possessed by the finished composite.

In addition to the aforementioned favorable characteristics which are possessed by the homogeneous thermoset copolymers of the present invention, another advantage in utilizing these copolymers as components of a laminate is when employing a halogenated derivative of a poly(vinyl benzyl ether) of a polyphenol or a polyalkadiene as a component of the copolymer. The presence of these halogenated derivatives, and especially the brominated or chlorinated derivative, will introduce a desired property enhancement to a substrate or reinforcement in that the laminate may then meet certain flammability requirements such as UL 94 flammability tests.

The following examples are given for purposes of illustrating the novel homogeneous thermoset copolymers of the present invention which possess the aforementioned desirable properties and to a method for the preparation thereof. However, it is to be understood that these examples are given for purposes of illustration and that the present invention is not necessarily limited thereto.

EXAMPLE I

A solution of 20 grams of styrenated tetrabromosubstituted p,p'-isopropylidenediphenol (bisphenol A) and 15 grams of toluene were heated to a temperature of 65° C. and mixed until the bisphenol A had dissolved. A second solution of 30 grams of 1,2-polybutadiene and 10 grams of toluene was heated to a temperature of 82° C. and mixed until the 1,2-polybutadiene was dissolved. The two solutions were then admixed at this elevated temperature following which a solution of 10 grams of toluene and 4 grams of a free radical initiator comprising dicumyl peroxide was added. The stable homogeneous varnish which resulted from this reaction had a viscosity of 40 cp after a period of 0.5 hours.

A laminate was prepared by coating the resin or varnish on a glass cloth substrate comprising vinylsilane-treated glass cloth, the coating of the glass cloth being applied to each layer which was placed on the stack. The laminate was B-staged by treatment in an oven for a period of 3.5 minutes at a temperature of 155° C. Analysis showed that there had been a 56% resin retention. Further analysis of the laminate, after curing the laminate for a period of 1 hour at 140° C. and 1 hour at 177° C., showed a major glass transition temperature of 350° C. and a minor glass transition of 90° C., a laminate dielectric constant of 4.02 and a dissipation factor of 0.057. Peel strength for a laminate clad with one ounce/ft$^2$ polytreat copper was 3.6 pounds/inch.

EXAMPLE II

A homogeneous thermoset copolymer is prepared by dissolving 20 grams of styrenated bisphenol A in toluene or methyl ethyl ketone at an elevated temperature of 65° C. A second solution is prepared by dissolving 30 grams of 1,2-polybutadiene in toluene or methyl ethyl ketone at a temperature of 65° C. and admixing the resulting solutions. A free radical initiator comprising dicumyl peroxide is added to the above admixture which is then allowed to react for a period of 1.0 minute at a temperature of 121° C. The resulting copolymer is then used to coat a vinylsilane-treated glass cloth substrate, each ply of the cloth being coated until a predetermined number of plies has been so treated. The coated substrate is then provided with copper foil on both sides thereof and cured at a temperature of 135° C. for a period of 20 minutes, followed by pressing for a period of 1 hour at a temperature of 177° C. to form the desired laminate.

EXAMPLE III

In like manner, other homogeneous thermoset copolymers may be prepared by admixing a solution of styrenated tetramethylsubstituted bisphenol A which is dissolved in toluene with a solution of 1,3-polybutadiene also dissolved in toluene at an elevated temperature of about 70° C. The reaction is allowed to proceed for a period of 0.1 to 2 hours in the presence of a free radical initiator comprising benzoyl peroxide, and the resulting resin, after recovery thereof, is utilized to coat a predetermined number of plies of vinylsilane-treated glass cloth. Copper foil is then placed on both sides of the substrate which is thereafter treated in a manner similar to that hereinbefore set forth in the above examples to form the desired laminate.

We claim as our invention:

1. A homogeneous thermoset copolymer of a poly(vinyl benzyl ether) of a polyphenol having the structure:

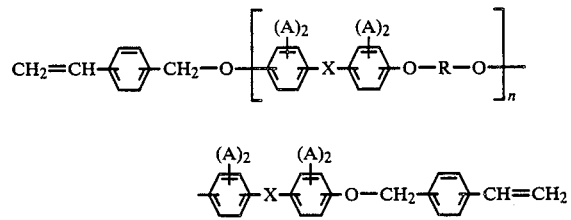

in which X is selected from the group consisting of

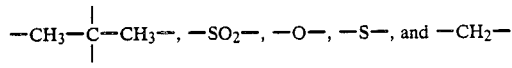

radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$— and —CH$_2$—C≡C—CH$_2$— radicals, A is independently selected from the group consisting of hydrogen, chlorine, bromine, fluorine, alkyl, alkoxy and phenyl radicals and n has an average value in the range of from about 0 to about 20, and a polyalkadiene in which the alkadiene monomer contains from 3 to about 8 carbon atoms.

2. The homogeneous thermoset copolymer as set forth in claim 1 in which said poly(vinyl benzyl ether) of a polyphenol is present in said copolymer in an amount in the range of from about 35% to about 80% by weight.

3. The homogeneous thermoset copolymer as set forth in claim 1 in which said polyalkadiene is present in said copolymer in an amount in the range of from about 65% to about 20% by weight.

4. The homogeneous thermoset copolymer as set forth in claim 1 in which said A is hydrogen.

5. The homogeneous thermoset copolymer as set forth in claim 1 in which said A is bromine.

6. The homogeneous thermoset copolymer as set forth in claim 1 in which said A is methyl.

7. The homogeneous thermoset copolymer as set forth in claim 4 in which said poly(vinyl benzyl ether) of a polyphenol is styrenated p,p'-isopropylidenediphenol.

8. The homogeneous thermoset copolymer as set forth in claim 5 in which said poly(vinyl benzyl ether) of a polyphenol is styrenated tetrabromosubstituted p,p'-isopropylidenediphenol.

9. A homogeneous thermoset copolymer as set forth in claim 6 in which said poly(vinyl benzyl ether) of a polyphenol is styrenated tetramethylsubstituted p,p'-isopropylidenediphenol.

10. The homogeneous thermoset copolymer as set forth in claim 1 in which said polyalkadiene is 1,2-polybutadiene.

11. The homogeneous thermoset copolymer as set forth in claim 1 in which said polyalkadiene is 1,3-polybutadiene.

12. The homogeneous thermoset copolymer as set forth in claim 1 in which said polyalkadiene is 1,2-polypentadiene.

* * * * *